(12) United States Patent
　　Chary

(10) Patent No.: US 12,577,673 B2
(45) Date of Patent: Mar. 17, 2026

(54) IN-SITU EPI GROWTH RATE CONTROL OF CRYSTAL THICKNESS USING PARAMETRIC RESONANCE SENSING

(71) Applicant: Applied Materials, Inc., Santa Clara, CA (US)

(72) Inventor: Sathya Shrinivas Chary, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 735 days.

(21) Appl. No.: 17/867,439

(22) Filed: Jul. 18, 2022

(65) Prior Publication Data

US 2024/0018659 A1　　Jan. 18, 2024

(51) Int. Cl.
| | |
|---|---|
| *C23C 16/52* | (2006.01) |
| *C23C 16/44* | (2006.01) |
| *C30B 25/14* | (2006.01) |
| *C30B 25/16* | (2006.01) |
| *G01B 17/02* | (2006.01) |
| *H01L 21/66* | (2006.01) |

(52) U.S. Cl.
CPC .......... *C23C 16/52* (2013.01); *C23C 16/4412* (2013.01); *C30B 25/14* (2013.01); *C30B 25/16* (2013.01); *G01B 17/025* (2013.01); *H01L 22/26* (2013.01)

(58) Field of Classification Search
None
See application file for complete search history.

(56) References Cited

U.S. PATENT DOCUMENTS

| | | | |
|---|---|---|---|
| 5,166,080 A | | 11/1992 | Schietinger et al. |
| 6,156,578 A | * | 12/2000 | Tom ......................... G01G 3/13 |
| | | | 422/62 |

(Continued)

FOREIGN PATENT DOCUMENTS

| | | |
|---|---|---|
| EP | 0823279 A2 | 2/1998 |
| JP | H09214014 A | 8/1997 |

(Continued)

OTHER PUBLICATIONS

PCT/US2023/010796, International Search Report and Written Opinion dated May 1, 2023, 12 pages.

(Continued)

*Primary Examiner* — Jethro M. Pence
(74) *Attorney, Agent, or Firm* — Patterson + Sheridan, LLP

(57)　　　　　ABSTRACT

A method and apparatus for processing semiconductor substrates is described herein. The apparatus includes one or more growth monitors disposed within an exhaust system of a deposition chamber. The growth monitors are parameteric resonance monitors and are configured to measure the film thickness grown on the growth monitors while a substrate is being processed within the deposition chamber. The growth monitors are connected to a controller, which adjusts the heating apparatus and gas flow apparatus settings during the processing operations. Measurements from the growth monitors as well as other sensors within the deposition chamber are used to adjust processing chamber models of the deposition chamber as substrates are processed therein.

20 Claims, 9 Drawing Sheets

(56) References Cited

U.S. PATENT DOCUMENTS

| | | | | | |
|---|---|---|---|---|---|
| 6,295,861 | B1 * | 10/2001 | Tom | ..................... | G01N 29/036 |
| | | | | | 436/151 |
| 10,196,738 | B2 | 2/2019 | Lee et al. | | |
| 2003/0124820 | A1 | 7/2003 | Johnsgard et al. | | |
| 2006/0233969 | A1 * | 10/2006 | White | ................... | C23C 14/547 |
| | | | | | 118/723 R |
| 2008/0110247 | A1 | 5/2008 | Shaw et al. | | |
| 2008/0131334 | A1 | 6/2008 | Kawamura et al. | | |
| 2013/0087287 | A1 * | 4/2013 | Hur | ................... | H01J 37/32834 |
| | | | | | 156/345.44 |
| 2014/0053779 | A1 * | 2/2014 | Martinson | ............... | C23C 16/52 |
| | | | | | 118/723 R |
| 2015/0013604 | A1 | 1/2015 | Nakagawa et al. | | |
| 2015/0125591 | A1 * | 5/2015 | Hsieh | ................. | C23C 16/4402 |
| | | | | | 118/712 |
| 2016/0268139 | A1 * | 9/2016 | Liu | ................... | H10D 30/0316 |
| 2017/0256463 | A1 | 9/2017 | Bailey, III et al. | | |
| 2018/0166306 | A1 * | 6/2018 | Hou | .................. | H01L 21/67173 |
| 2020/0033294 | A1 * | 1/2020 | Offermanns | ............ | C23C 14/12 |
| 2020/0135520 | A1 * | 4/2020 | Reuter | .............. | B01D 53/0446 |
| 2020/0176291 | A1 * | 6/2020 | Rinzan | ............. | C23C 16/45525 |
| 2021/0028075 | A1 | 1/2021 | Zhu et al. | | |
| 2021/0388501 | A1 | 12/2021 | Choi et al. | | |

FOREIGN PATENT DOCUMENTS

| | | |
|---|---|---|
| JP | 200065720 A | 3/2000 |
| JP | 2005517295 A | 6/2005 |
| JP | 2009228059 A | 10/2009 |
| JP | 2022020718 A | 2/2022 |
| KR | 10-2013-0038623 A | 4/2013 |

OTHER PUBLICATIONS

Muroi, et al., Real Time Evaluation of Silicon Epitaxial Growth Process by Exhaust Gas Measurement using Quartz Crystal Microbalance, Materials Science in Semiconductor Processing, 88 (2018), pp. 192-197.

Office Action for Japanese Application No. 2025-502371 mailed Dec. 23, 2025.

Korean Office Action dated Dec. 15, 2025 for Application No. 10-2025-7004746.

* cited by examiner

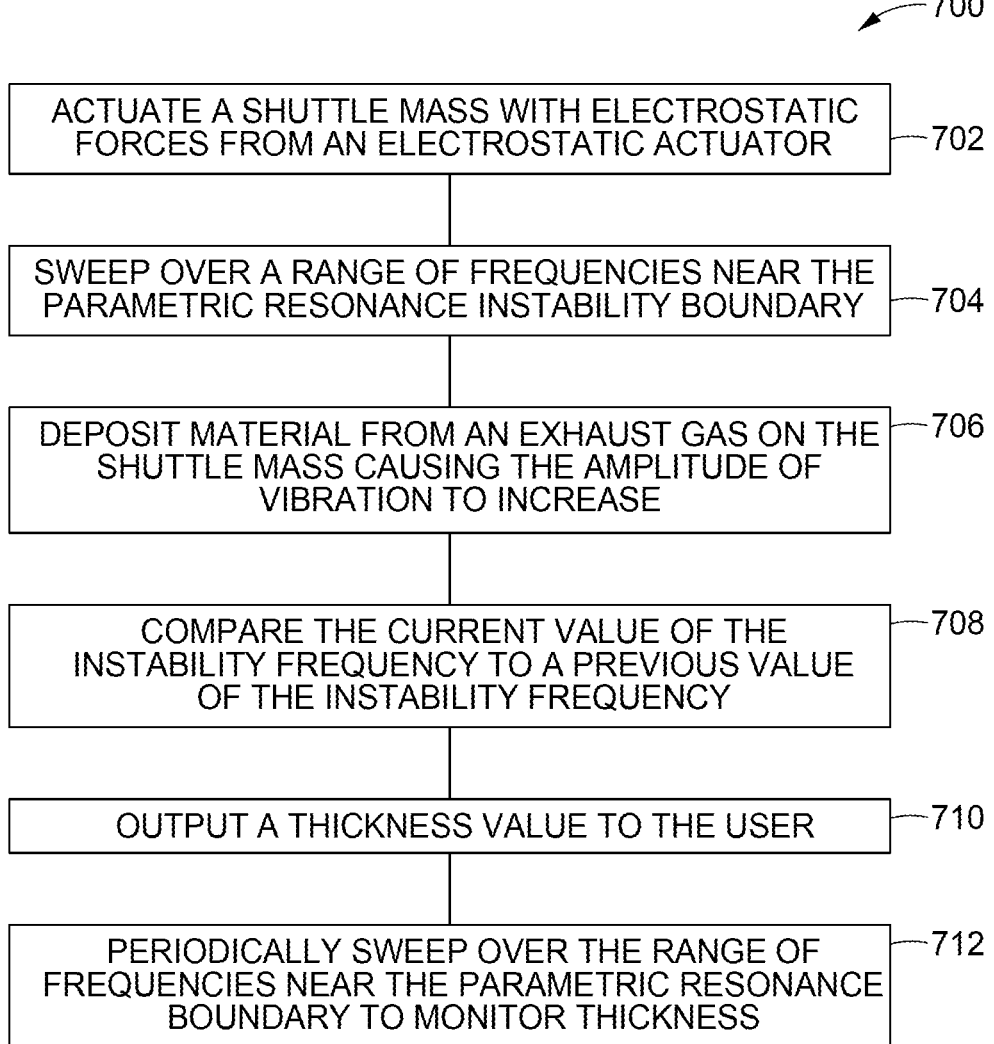

700

ACTUATE A SHUTTLE MASS WITH ELECTROSTATIC FORCES FROM AN ELECTROSTATIC ACTUATOR ⌐702

SWEEP OVER A RANGE OF FREQUENCIES NEAR THE PARAMETRIC RESONANCE INSTABILITY BOUNDARY ⌐704

DEPOSIT MATERIAL FROM AN EXHAUST GAS ON THE SHUTTLE MASS CAUSING THE AMPLITUDE OF VIBRATION TO INCREASE ⌐706

COMPARE THE CURRENT VALUE OF THE INSTABILITY FREQUENCY TO A PREVIOUS VALUE OF THE INSTABILITY FREQUENCY ⌐708

OUTPUT A THICKNESS VALUE TO THE USER ⌐710

PERIODICALLY SWEEP OVER THE RANGE OF FREQUENCIES NEAR THE PARAMETRIC RESONANCE BOUNDARY TO MONITOR THICKNESS ⌐712

FIG. 7

IN-SITU EPI GROWTH RATE CONTROL OF CRYSTAL THICKNESS USING PARAMETRIC RESONANCE SENSING

BACKGROUND

Field

Embodiments of the present disclosure generally relate to apparatus and methods for fabricating semiconductor devices. More specifically, the apparatus disclosed herein relates to exhaust assemblies and growth rate sensors within a semiconductor process chamber. Methods of using the same are also disclosed.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source uniformly heats the substrate within strict tolerances. The temperature of the substrate can affect the uniformity of the material deposited on the substrate.

The ability to monitor the growth/deposition thickness within the process chamber has a significant impact on throughput and production yields. At present, in situ monitoring of growth/deposition thickness is not generally carried out in epitaxy reactors. Currently, processes are timed to achieve desired thickness, which is then measured ex situ. Conventional attempts to include sensors within the process chamber have resulted in limited resolution and the addition of sensors increases the downtime of the process chamber and increases the cost of ownership. Attempts to offset these costs still do not provide direct measurement of mass or. Substrates processed between calibration and measurement operations also have less precise deposition rates due to changes in chamber conditions. Current sensors within a process chamber include pyrometers and pressure sensors, which do not provide desired film growth determination accuracy.

Therefore, a need exists for improved growth rate monitoring.

SUMMARY

The present disclosure generally relates to apparatus and methods for fabricating semiconductor devices. More specifically, the apparatus disclosed herein relates to exhaust assemblies and growth rate sensors within a semiconductor process chamber. Methods of using the same are also disclosed.

In another embodiment, an exhaust system for substrate processing is disclosed. The exhaust system includes a first exhaust plenum, a first exhaust entry opening fluidly connected to the first exhaust plenum, a first plurality of fins disposed adjacent to the first exhaust entry opening within the first exhaust plenum, a first exhaust exit opening fluidly connected to the first exhaust plenum, a first baffle plate disposed adjacent to the first exhaust exit opening and configured to narrow a width of the first exhaust plenum, and at least one growth monitor disposed downstream of the first baffle plate. The growth monitor is configured to measure a thickness of a material deposited on the growth monitor. At least one growth monitor is a parametric resonance sensor.

In another embodiment, a processing system suitable for semiconductor substrate processing. The processing system includes a chamber body forming a process volume, a substrate support, an upper window, a lower window, an injector, and an exhaust system. The substrate support disposed within the process volume of the chamber body. The upper window disposed above the substrate support and the lower window disposed below the substrate support. The upper window and the lower window define the process volume. The injector is disposed through one side of the chamber body and configured to introduce a process gas to the process volume. The exhaust system is disposed through a second side of the chamber body opposite the injector. The exhaust system includes at least one growth monitor configured to measure a thickness of a material deposited on the growth monitor. The growth monitor is a parametric resonance sensor.

In another embodiment, a controller of a process system storing instructions is disclosed. The controller, when executed by a processor, causes the system to process a substrate within a processing chamber by flowing a process gas through a process volume from a process gas inlet, depositing the gas on the substrate, and exhausting the process gas through an exhaust system. The exhaust system further comprises a growth monitor. The growth monitor comprising a parametric resonance sensor. The controller further causes the system to deposit the process gas on the growth monitor, measure a film growth on the growth monitor, calculate a film growth rate on the substrate, and adjust a processing chamber parameter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 7 illustrates a method of measuring the thickness of a material on a substrate within the deposition chamber of FIG. 1, according to certain embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to exhaust assemblies and growth rate sensors within a semiconductor process chamber. The growth rate sensors are parametric resonance film thickness monitors and enable measurement of a film thickness on the growth rate sensor. The film thickness on the growth rate sensor is equated to a growth rate on the substrate within the process chamber. The thickness measurements may then be utilized to adjust one or more process controls within the process volume of the process chamber and improve film growth across the substrate.

The location and number of parametric resonance monitors provides increased sensitivity and sensor life cycles. The configuration of the exhaust system around the parametric resonance monitors further enables the gas flow within the process volume to remain the same or have minimal flow impact, while increasing process gas flow across the parametric resonance monitors to improve growth rate on the parametric resonance monitors. Therefore, the exhaust system may include configurations of fins and baffles to control gas flow rate. The fins, baffles, and other components of the exhaust system may further be formed from or coated with a material to increase heat retention of the process gas as the process gas flows through the exhaust system. This enables more predictable film growth on the parametric resonance monitors.

Software algorithms within the process chamber controller take the growth rate measurements from the parametric resonance monitors and enable calibration of other sensors within the process chamber as well as process conditions within the process chamber to improve film thickness growth rates.

Figure 1:
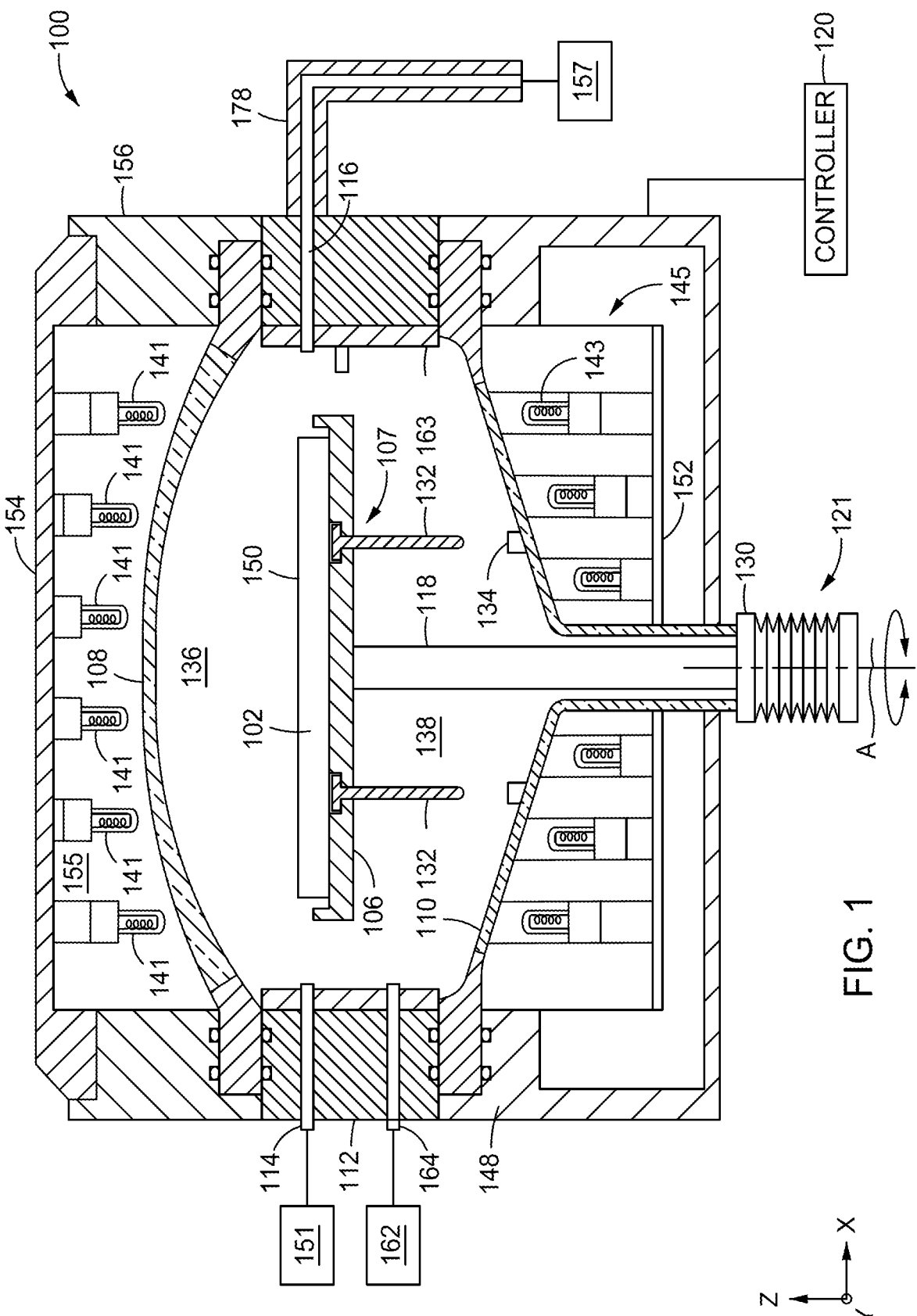
FIG. 1 is a schematic illustration of a deposition chamber, according to certain embodiments.

FIG. 1 is a schematic illustration of a deposition chamber 100, according to embodiments of the present disclosure. The deposition chamber 100 is an epitaxial deposition chamber. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108, a lower window 110, a plurality of upper lamps 141, and a plurality of lower lamps 143. As shown, the controller 120 is in communication with the deposition chamber 100 and is used to control processes, such as those described herein. The substrate support 106 is disposed between the upper window 108 and the lower window 110. The plurality of upper lamps 141 are disposed between the upper window 108 and a lid 154. The plurality of upper lamps 141 form a portion of the upper lamp module 155. The lid 154 may include a plurality of sensors (not shown) disposed therein for measuring the temperature within the deposition chamber 100. The plurality of lower lamps 143 are disposed between the lower window 110 and a floor 152. The plurality of lower lamps 143 form a portion of a lower lamp module 145. The upper window 108 is an upper dome and is formed of an energy transmissive material, such as quartz. The lower window 110 is a lower dome and is formed of an energy transmissive material, such as quartz.

A process volume 136 is formed between the upper window 108 and the lower window 110. The process volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides are disposed below the plurality of process gas inlets 114 and the one or more exhaust gas outlets 116. The flow guide is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the process volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157.

The one or more exhaust gas outlets 116 are further connected to or include an exhaust system. The exhaust system fluidly connects the one or more exhaust gas outlets 116 and the exhaust pump 157. The exhaust system as described herein includes one or more growth monitors 310 (FIG. 3A) and is configured to assist in the controlled deposition of a layer on the substrate 102.

Figure 2:
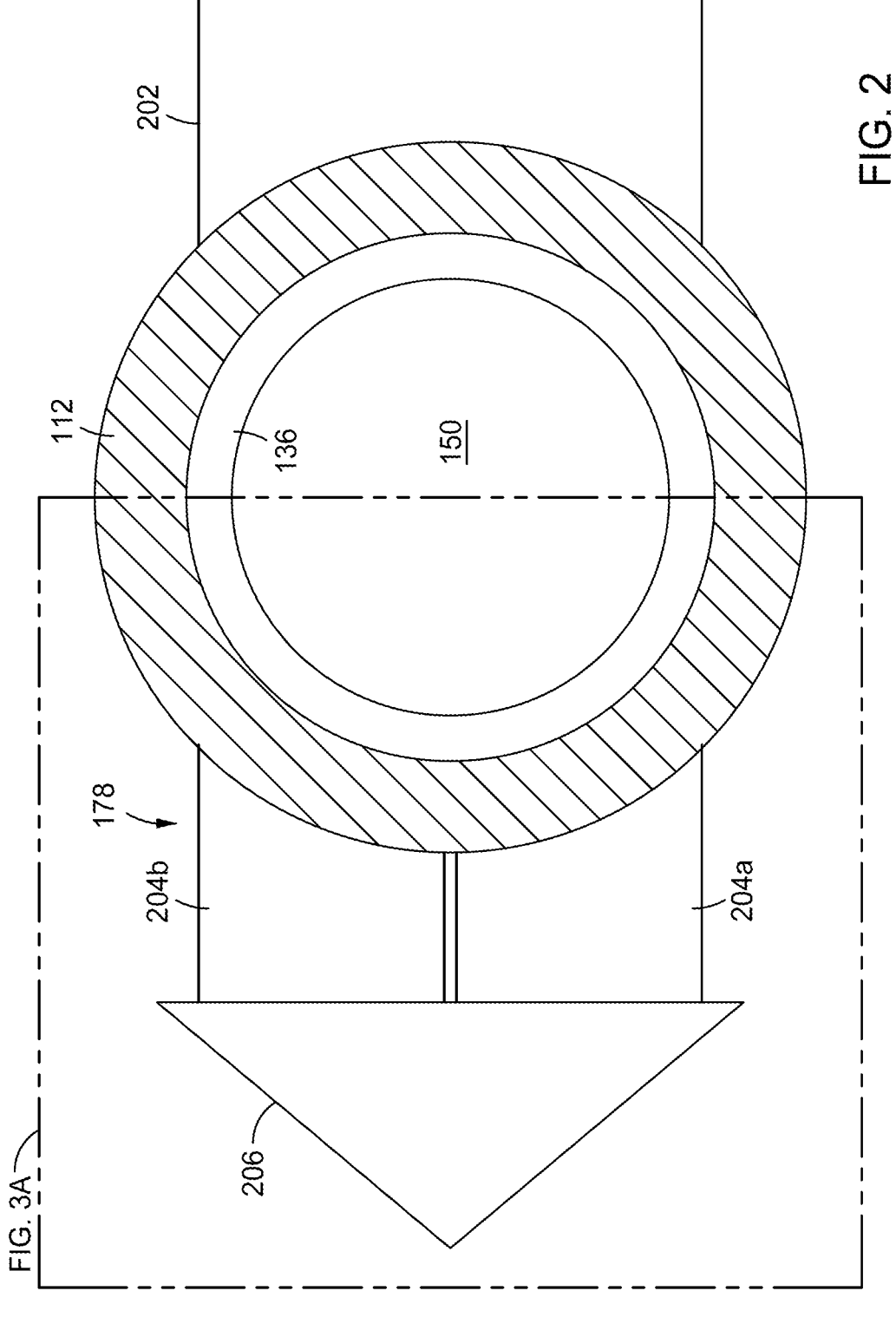
FIG. 2 illustrates a cross-sectional plan view of the deposition chamber of FIG. 1, according to certain embodiments.

FIG. 2 illustrates a cross-sectional plan view of the deposition chamber 100 of FIG. 1, according to embodiments of the present disclosure. The deposition chamber 100 includes an injector 202 disposed across from the exhaust system 178. The injector 202 includes the process gas inlets 114 and is fluidly coupled to the process gas source 151. The injector 202 may be disposed through as least a portion of the flow module 112 or may be a part of the flow module 112. The exhaust system 178 is disposed on the opposite side of the process volume 136 from the injector 202. The exhaust system 178 is formed through, attached to, or a part of the flow module.

The exhaust system 178 further includes at least one exhaust passage body 204a, 204b. The exhaust passage bodies 204a, 204b form an exhaust path for gas leaving the process volume 126 before entering an exhaust collector 206. As shown in FIG. 2, there is a first exhaust passage body 204a and a second exhaust passage body 204b. The first exhaust passage body 204a and the second exhaust passage body 204b are mirror images and may be similar in size and configuration. In other embodiments, there may be more or less exhaust passage bodies 204a, 204b. In some embodiments there is only one exhaust passage body, such that the two exhaust passage bodies 204a, 204b are merged into a single body. In yet other embodiments, there may be three or more exhaust passage bodies, such as three exhaust passage bodies 204a, 204b. The size and configuration of the exhaust passage bodies 204a, 204b may change depending upon the size and operation of the deposition chamber 100.

Both of the first exhaust passage body 204a and the second exhaust passage body 204b are coupled to the exhaust collector 206 on the opposite end of the exhaust passage bodies 204a, 204b from the process volume 136. The exhaust collector 206 is configured to collect the exhaust from the first exhaust passage body 204a and the second exhaust passage body 204b. The exhaust collector 206 narrows as the exhaust collector 206 extends away from the exhaust passage bodies 204a, 204b.

Figure 3A:
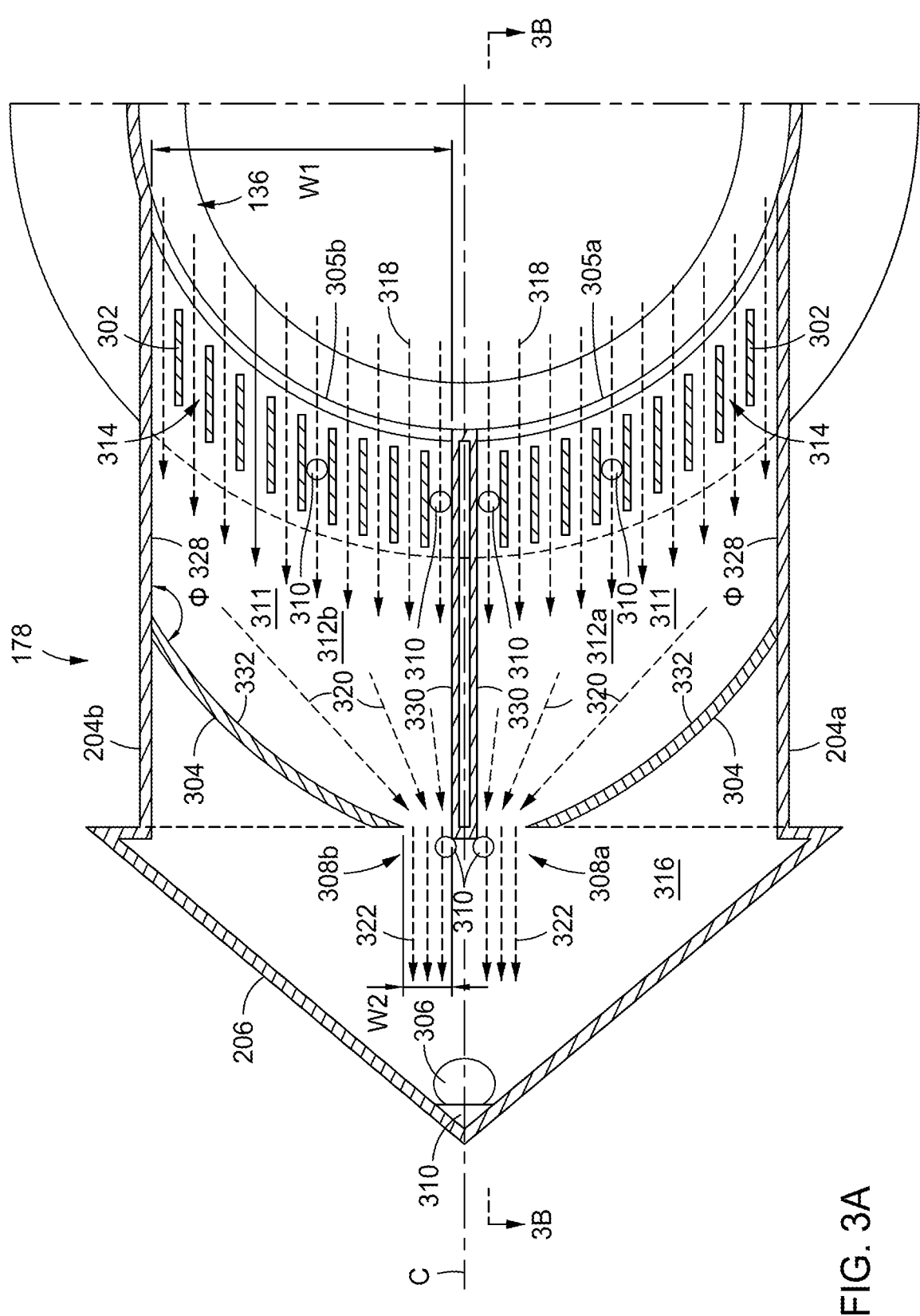
FIG. 3A illustrates a cross-sectional plan view of the exhaust system of the deposition chamber of FIG. 1, according to certain embodiments.

FIG. 3A illustrates a cross-sectional plan view of the exhaust system 178 of the deposition chamber 100 of FIG. 1, according to embodiments of the present disclosure. The exhaust system 178 is configured to control the exhaust gas flow exiting the process volume 126 before being flowed over one or more growth monitors 310. Increased flow volume over the growth monitors 310 relative to the flow volume at the entrance to the exhaust passage bodies 204a, 204b enhances film growth on the growth monitors 310. Therefore, the width of each of the exhaust passage bodies 204a, 204b is narrowed from an entry width $W_1$ to an exit width $W_2$ to enhance flow volume. A fin array 314 and one or more baffles 304 are positioned within each of the exhaust passage bodies 204a, 204b to enable the narrowing of the exhaust passage bodies 204a, 204b, while reducing the impact of the narrowing on the flow path of the process gases through the process volume 136.

As the process gas flows out of the process volume 136 and into the exhaust system 178, the process gas is flowing in a first flow path 318. The first flow path 318 is primarily parallel with the surface of the substrate 136 and the gas flow out of the injector 202. The process gas is flowed into the exhaust system 178 through an exhaust entry opening 305a, 305b disposed through each of the exhaust passage bodies 204a, 204b. Therefore, a first exhaust entry opening 305a is disposed through a first end of the first exhaust passage body 204a, while a second exhaust entry opening 305b is disposed through a first end of the second exhaust passage body 204b. The exhaust entry openings 305a, 205b are in fluid communication with exhaust plenums 312a, 312b. The exhaust plenums 312a, 312b are disposed within each of the exhaust passage bodies 204a, 204b. Therefore, a first exhaust plenum 312a is disposed within the first exhaust passage body 204a and a second exhaust plenum 312b is disposed within the second exhaust passage body 204b. The first exhaust entry opening 305a is in fluid communication with the first exhaust plenum 312a and the second exhaust entry opening 305b is in fluid communication with the second exhaust plenum 312b.

Each of the exhaust entry openings 305a, 305b have an entry width $W_1$. The entry width $W_1$ is about 10 mm to about 210 mm, such as about 45 mm to about 210 mm, such as about 75 mm to about 175 mm, such as about 100 mm to about 155 mm. The entry width $W_1$ is therefore less than or equal to half of the width of the process volume 136.

An exhaust exit opening 308a, 308b is disposed on the opposite side of the exhaust passage bodies 204a, 204b from the exhaust entry openings 305a, 305b. Therefore, a first exhaust exit opening 308a is disposed on a second side of the first exhaust passage body 204a opposite the first side and in fluid communication with the first exhaust plenum 312a. The second exhaust exit opening 308b is disposed on a second side of the second exhaust passage body 204b opposite the first side and in fluid communication with the second exhaust plenum 312b. The exhaust exit openings 308a, 308b are smaller in width than the exhaust entry openings 305a, 305b. The exhaust exit openings 308a, 308b have an exit width $W_2$ of about 15 mm to about 110 mm, such as about 20 mm to about 100 mm, such as about 20 mm to about 40 mm. The exit width $W_2$ being smaller than the entry width $W_1$ enables a higher concentration of process gases to flow over the growth monitors 310.

The ratio of the entry width $W_1$ to the exit width $W_2$ is about 2:1 to about such as about 3:1 to about 10:1, such as about 4:1 to about 8:1. The ratio of the entry width $W_1$ to the edit width $W_2$ enables sufficient film growth on the growth monitors 310, while reducing the impact of the reduced exit width $W_2$ on backpressure and flow path through the process volume 136.

Process gases flowing through the deposition chamber 100 enter the exhaust passage bodies 204a, 204b through the exhaust entry openings 305a, 305b while in the first flow path 318 before changing to a second flow path 320 as one or more baffles 304 narrows the exhaust plenums 312a, 312b to the exit width $W_2$ adjacent the exit openings 308a, 308b. The second flow path 320 brings the process gases towards a center line C of the exhaust system and towards one side of the exhaust plenums 312a, 312b, such as the inner side of the exhaust plenums 312a, 312b. Once the process gases are flowed through the exit openings 308a, 308b, the path of the process gases is changed to a third flow path 322. The third flow path 322 is a condensed flow path. The third flow path 322 is disposed through the collector plenum 316. The collector plenum 316 is a plenum disposed within the exhaust collector 206.

The fin arrays 314 disposed within each of the exhaust passage bodies 204a, 204b are configured to maintain the first flow path 318 through at least a portion of the exhaust plenums 312a, 312b. The fin arrays 314 include a plurality of fins 302, such that a first plurality of fins 302 are disposed within the first exhaust plenum 312a of the first exhaust passage body 204a. A second plurality of fins 302 are disposed within the second exhaust plenum 312b and the second exhaust passage body 204b. The fin arrays 314 are configured to maintain good flow control through the process volume 136 and extend from a position adjacent to the exhaust entry openings 305a, 305b.

The number of fins 302 within the fin arrays 314 may be at least four fins 302, such as at least 5 fins 302, such as 5 fins 302 to about 30 fins 302, such as 5 fins 302 to about 20 fins 302. The number of fins 302 assists in creating smaller gaps between each adjacent fin 302 and control of the first flow path 318.

One or more growth monitors 310 are disposed within the fin arrays 314, such as between two adjacent fins 302. There may be two or more growth monitors 310 disposed within each fin array 314 of both the first exhaust passage body 204a and the second exhaust passage body 204b. The growth monitors 310 within the fin arrays 314 may assist in providing measurements of the growth rate at different positions on the substrate 102, as different growth monitors 310 may be correlated to different locations on a substrate.

Each of the fins 302 within the fin arrays 314 are parallel to one another. The fins 302 extend in a direction parallel to the desired first flow path 318 and parallel to the gas flowing out of the injector 202. Other configurations of the fin arrays 314 are contemplated. In some embodiments, each of the fins 302 are a similar length. In other embodiments, each of the fins 302 are not necessarily the same length, such that fins 302 closer to the centerline C of the process volume 136 and the exhaust system 178 are shorter than fins 302 further from the centerline C.

Once the process gases leave the fin arrays 314, the process gases are flown into the main portion 311 of the exhaust plenums 312a, 312b. The main portion 311 of the exhaust plenums 312a, 312b is an open space and may assist in reducing backpressure, which would build up if the fin arrays 314 extended all the way to the baffle plate 304. In some embodiments, there is a gap of at least 5 mm between the end of the fin arrays 314 and the closest portion of the baffle plate 304, such as about 5 mm to about 40 mm.

The baffle plate 304 extends from an outer surface 328 of each of the exhaust passage bodies 204a, 204b and towards an inner surface 330 of each of the exhaust passage bodies 204a, 204b. The outer surface 328 is the inside surface of the exhaust plenums 312a, 312b furthest from the centerline C. The inner surface 330 is the inside surface of the exhaust plenums 312a, 312b closest to the centerline C. Therefore, the baffle plate 304 within the first exhaust passage body 204a extends from the outer surface 318 of the first exhaust plenum 312a and towards the inner surface 330 of the first exhaust passage plenum 312a or the centerline C of the exhaust system 178. The baffle plate 304 within the second exhaust passage body 204b extends from the outer surface 318 of the second exhaust plenum 312b and towards the inner surface 330 of the second exhaust passage plenum 312b or the centerline C of the exhaust system 178.

The baffle plate 304 extends at an angle φ with respect to the outer surface 328 of each of the exhaust plenums 312a, 312b. The angle φ is the inside angle facing the fin array 314. The angle φ is an obtuse angle, such that the angle φ is greater than about 90 degrees, such as about 100 degrees to about 170 degrees, such as about 100 degrees to about 160 degrees, such as about 110 degrees to about 145 degrees. The angle at which the baffle plate 304 is disposed assists in controlling the rate of restriction of the exhaust plenums 312a, 312b. The baffle plates 304 are disposed at an angle other than 0 degrees or 90 degrees with respect to the orientation of the fins 302, such as between about 10 degrees and about 80 degrees with respect to the orientation of the fins 302. The baffle plates 304 extend across over 50% of the width of each of the exhaust plenums 312a, 312b, such as over 60% of the width of each of the exhaust plenums 312a, 312b, such as over 70% of the width of each of the exhaust plenums 312a, 312b. In some embodiments, the baffle plates 304 have a radius of curvature defined as the radius from the center of the process volume 136 of the deposition chamber 100 to a gas guide surface 332. In some embodiments, the radius of curvature changes across the gas guide surface 332, such that the portion of the gas guide surface 332 closer to the inner surfaces 330 have a smaller radius of curvature. The radius of curvature of the gas guide surface 332 may also be other radii other than the radius from the center of the process volume 136. Each baffle plate 304 has a gas guide surface 332. The gas guide surface 332 is the surface of the baffle plate 304 facing the main portion 311 of the exhaust plenums 312a, 312b as well as the fin arrays 314.

The baffle plates 304 may either have a curved gas guide surface 332, a straight gas guide surface 332, or a multi-faceted gas guide surface 332. The gas guide surface 332 is shown as being straight in FIG. 3A, but may be curved in some embodiments, such that the gas guide surface 332 follows a circumference of a circle, an ellipse, a hyperbola, or a parabola. A curved surface may allow for better gas flow control with reduced eddying or turbulence within the gas flow path. The curvature of the gas guide surface 332 may vary depending upon the size of the deposition chamber 100 and the size of the exhaust system 178.

The exhaust exit openings 308a, 308b are disposed between an innermost portion of each of the baffle plates 304 and the inner surface 330 of each of the exhaust plenums 312a, 312b. The first exhaust exit opening 308a is disposed within the first exhaust plenum 312a and connects the first exhaust plenum 312a to the collector plenum 316. The second exhaust exit opening 308b is disposed within the second exhaust plenum 312b and connects the second exhaust plenum 312b to the collector plenum 316.

One or more growth monitors 310 are located either within the exhaust exit openings 308a, 308b or just downstream of the exhaust exit openings 308a, 308b. A first growth monitor 310 is disposed within the first exhaust exit opening 308a or just downstream of the exhaust exit opening 308a. A second growth monitor 310 is disposed within the second exhaust exit opening 308b or just downstream of the second exhaust exit opening 308b. The growth monitors 310 being disposed just downstream of the exhaust exit openings 308a, 308b is defined as the growth monitors 310 being disposed within 10 mm of the exhaust exit openings 308a, 308b and away from the fin arrays 314.

The baffle plates 304 narrow the passage through which exhaust gases pass through the exhaust plenums 312a, 312b and therefore increase the density or concentration of the exhaust gases flowing over the growth monitors 310. The growth monitors 310 are disposed in either a top surface 326 or a bottom surface 327 (FIG. 3B) of the exhaust plenums 312a, 312b so that the growth monitors 310 do not block the third flow path 322, but are instead disposed in line with the third flow path 322. The growth monitors 310 are located at least partially inside of the collector plenum 316.

Figure 3B:
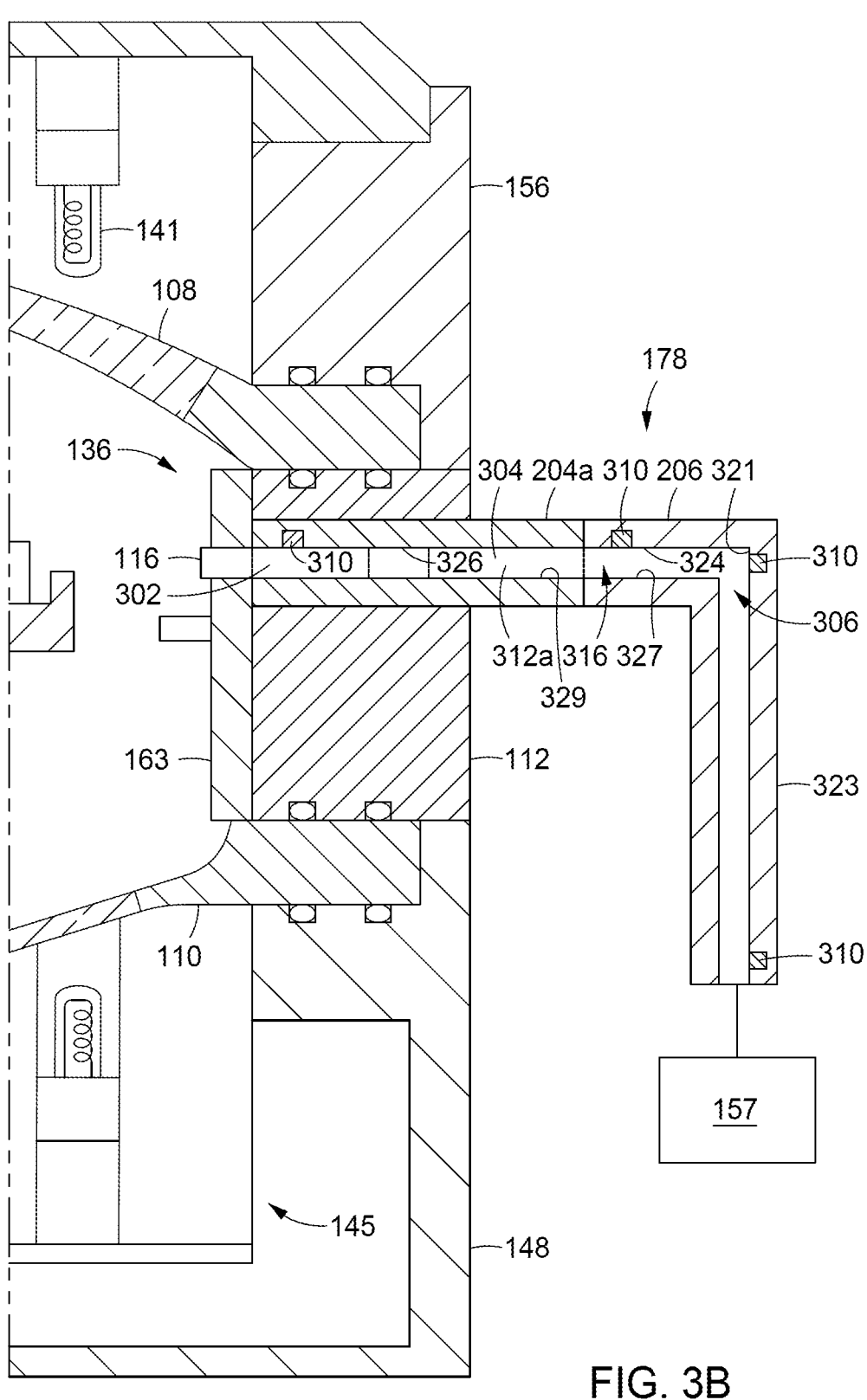
FIG. 3B illustrates a cross-sectional side view of the exhaust system of the deposition chamber of FIG. 1, according to certain embodiments.

Exhaust gas passes over the growth monitors 310 and into the collector plenum 316 before being removed from the exhaust collector 206 through a conduit opening 306 of the exhaust conduit 323 (FIG. 3B). The width of the collector plenum 316 adjacent to the exit openings 308a, 308b is wider than the exit openings 308a, 308b, such that the width of the collector plenum 316 adjacent to each of the exit openings 308a, 308b is similar to the entry width $W_1$ and the total width of the collector plenum 316 is similar to or greater than two times the entry width $W_1$.

The conduit opening 306 is disposed at a portion of the collector plenum 316 opposite the exit openings 308a, 308b. The conduit opening 306 is configured to enable venting of the exhaust gas within the exhaust collector 206 through an exhaust conduit 323 and to an exhaust pump 157. Adjacent to the conduit opening 306 and within the collector plenum 316 is another growth monitor 310. The growth monitor 310 adjacent to the conduit opening 306 is disposed on a back sidewall 321 (FIG. 3B) of the collector plenum 316 furthest from the exit openings 308a, 308b. In some embodiments, the growth monitor 310 may be disposed directly above the conduit opening 306 or within the conduit opening 306, such as within an upper portion of the exhaust conduit 323.

At least the fins 302 and the baffle plate 304 may be formed from or coated with a material with a high thermal conductivity, such as a material with a thermal conductivity of above about 100 W/m·° K, such as above about 150 W/m·° K, such as above about 175 W/m·° K. The material of the fins 302 is chosen to reduce contamination of the deposition chamber 100 while also maintaining the temperature of the exhaust gas flowing through the exhaust plenums 312a, 312b before flowing over the growth monitors 310. In some embodiments, at least a portion of the wall forming the exhaust plenums 312a, 312b is coated in the high thermal conductivity material similar to the fins 302 and the baffle plate 304. The inside of the exhaust collector 206 may similarly be coated in the high thermal conductivity material. The high thermal conductivity material may be silicon carbide (SiC). Other suitable high thermal conductivity materials are contemplated. In some embodiments, the fins 302 and the baffle plates 304 are formed of graphite and coated with silicon carbide. The high thermal conductivity material conducts heat from the process volume 136 and reduces the rate of cooling of exhaust gases flowed through the exhaust plenums 312a, 312b. Keeping the exhaust gases heated before being flowed over the growth monitors 310 enables more consistent film formation on the growth monitors 310 to provide more accurate estimates of film growth rates within the process chamber.

FIG. 3B illustrates a cross-sectional side view of the exhaust system 178 of the deposition chamber 100 of FIG. 1, according to embodiments of the present disclosure. As shown in FIG. 3B, the exhaust plenums 312a, 312b of the exhaust system 178 extend through at least a portion of the flow module 112, such that the exhaust plenums 312a, 312b extend through the flow module 112. The fins 302 are disposed adjacent to the process volume 136.

The fins 302 and the baffle plates 304 extend the full height of the exhaust plenums 312a, 312b, such that the fins 302 and the baffle plates 304 extend between the top surface 326 and the bottom surface 327 of the exhaust plenums 312a, 312b. The growth monitors within the fin arrays 314 are disposed on the top surface 326.

The exhaust collector 206 is connected to the back end of the exhaust system 178. The exhaust collector 206 includes a top surface 328, a bottom surface 327, and a back sidewall 324. The growth monitors 310 just downstream of the exhaust exit openings 308a, 308b are positioned on the top surface 328 of the collector plenum 316 within the exhaust collector 206. Another growth monitor 310 is disposed on the back sidewall 321 of the collector plenum 316. The positioning of the growth monitors 310 enables accurate film growth rate measurements by each of the growth monitors 310. The measurements from each of the growth monitors 310 may be mapped to see differences in growth rate across different positions of the substrate 102.

The conduit opening 306 is disposed through the bottom surface 327 of the collector plenum 316 and opens into the exhaust conduit 323. The exhaust conduit 323 extends downward from the conduit opening 306 and is fluidly connected to the exhaust pump 157. Another growth monitor 310 may be positioned on an inner wall of the exhaust conduit 323 downstream of the growth monitor 310 on the back sidewall 321 of the collector plenum 316.

In some embodiments, more or less growth monitors 310 may be utilized within the exhaust system 178. In some embodiments, only the growth monitors 310 adjacent to the exhaust exit openings 308a, 308b are disposed within the exhaust system 178. In other embodiments, the growth monitors 310 adjacent to the exhaust exit openings 308a, 308b may be a single growth monitor 310. In yet other embodiments, the growth monitors 310 adjacent to the exhaust exit openings 308a, 308b and the growth monitor 310 on the back sidewall 321 of the collector plenum 316 are utilized.

Figure 4A:
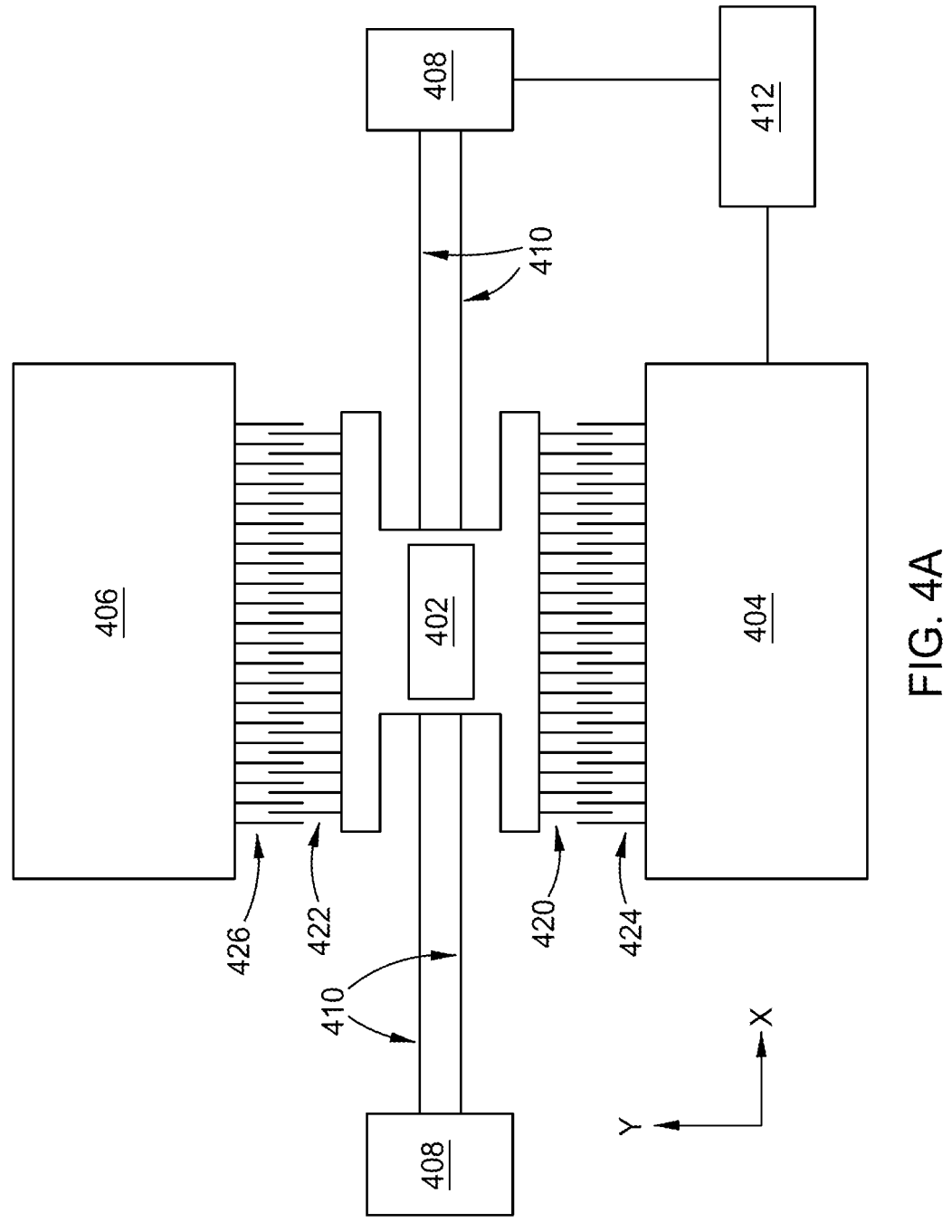
FIGS. 4A and 4B illustrate two embodiments of a growth monitor for use within the deposition chamber of FIG. 1.
Figure 4B:
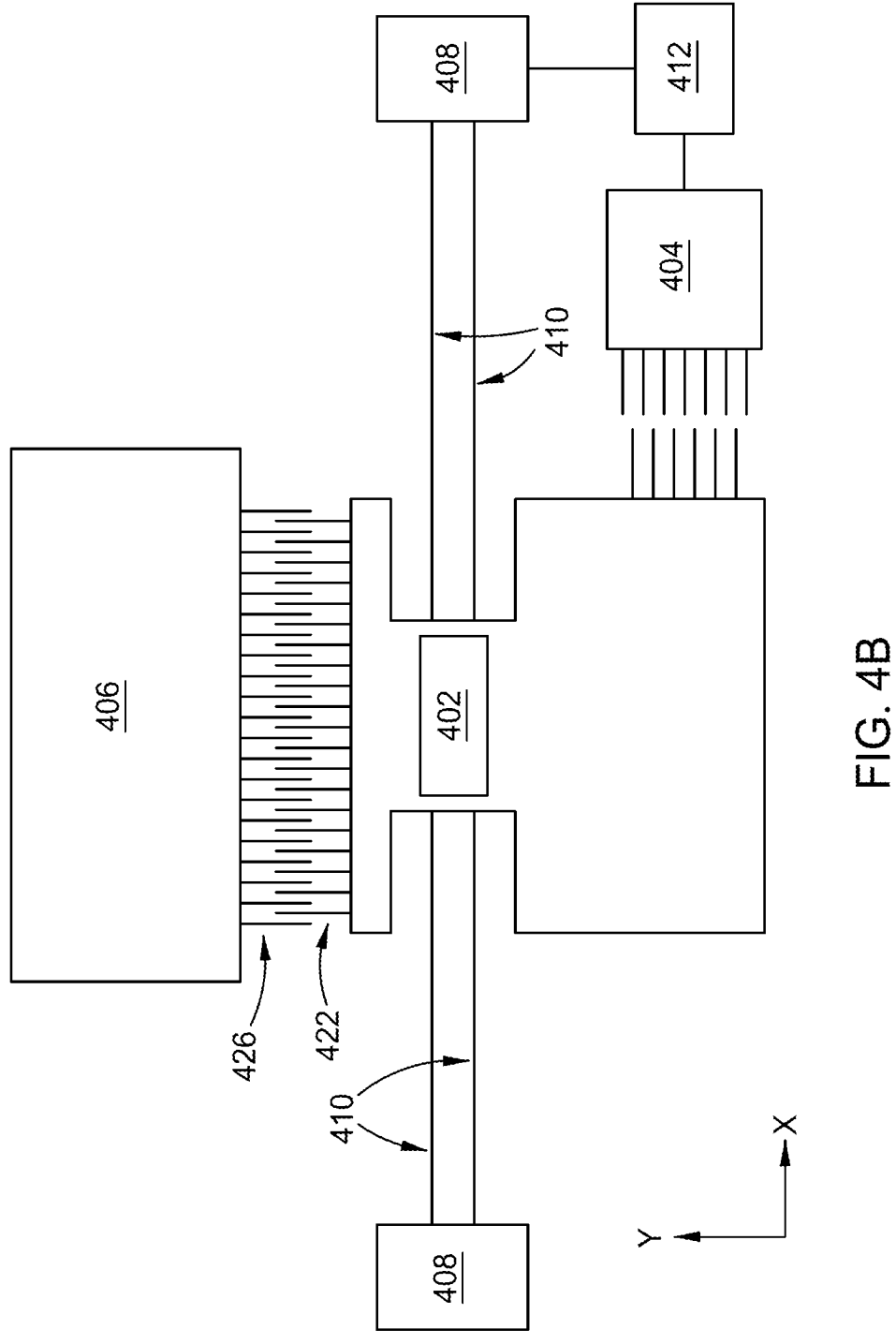

FIGS. 4A and 4B illustrate a growth monitor 310 for use within the deposition chamber 100 of FIG. 1, according to embodiments of the present disclosure. The growth monitor 310 is a parametric resonance sensor that includes a shuttle mass 402, an electrostatic actuator 404, an amplitude and/or velocity sensor 406, a plurality of anchors 408, and a plurality of beams 410. The shuttle mass 402 is one or more of a silicon containing material, bulk titanium, and electroplated nickel.

The shuttle mass 402 further includes a first set of fingers 420 and a third set of fingers 424. The electrostatic actuator 404 further includes a second set of fingers 422. In one embodiment, the amplitude and/or velocity sensor 406 is a capacitor sensor. The capacitance sensor 406 further includes a fourth set of fingers 426. The first through fourth set of fingers 420, 422, 424, and 426 can be accelerometers, gyroscopes, or other similar systems. The growth monitor 310 further is coupled to a potential source 412 capable of applying a voltage to the electrostatic actuator 404. The potential source 412 is further configured to act as (or may include) a ground for connection to one of the plurality of anchors 408. The plurality of beams 410 are configured to couple the shuttle mass 402 to the anchors 408 such that the anchors 408 secure the shuttle mass 402 to the exhaust collector 206. In one example, the amplitude and/or velocity sensor 406 may additionally or alternatively be a frequency sensor.

In operation, the first set of fingers 420 are in spaced apart relation with the second set of finger 422 while the third set of fingers 424 are in spaced apart relation with the fourth set of fingers 426. In one embodiment shown in FIG. 4A, the spaced apart relation of the sets of fingers is an interdigitated comb configuration, i.e., the first finger set 420 is interdigitated with the second finger set 422 and the third finger set 424 is interdigitated with the fourth finger set 426. In yet another embodiment, the spaced apart relation is an interdigitated curved quadratic comb finger configuration. When the potential source 412 applies a bias to the electrostatic actuator 404, the electrostatic actuator 404 is configured to actuate the shuttle mass 402 at an actuation frequency. The input bias actuates the shuttle mass 402 over a range of frequencies close to the parametric resonance instability frequency. The bias is applied across the first finger set 420 and the second finger set 424, causing the normal forces on both sides of each finger of the finger set to cancel out. However, the lateral forces actuate the first finger set 420 parallel to the second finger set 422, thus actuating the shuttle mass 402. In one embodiment, the actuation is translational. In another embodiment, the actuation is rotational. In another embodiment shown in FIG. 4B, the spaced apart relation of the sets of fingers is a non-interdigitated comb finger configuration. The shuttle mass 402 is anchored in place by the anchors 408 through the plurality of beams 410. The plurality of beams 410 are configured to resist the actuation of the shuttle mass 402. As the shuttle mass 402 moves relative to the electrostatic actuator 404 from the force between the first finger set 420 and the second finger set 422, the plurality of beams 410 act as springs to move the shuttle mass 402 back to its original position. The third finger set 424 is configured to move in parallel to the fourth finger set 426 as a result of the actuation of the shuttle mass 402. The capacitance sensor is configured to measure the change in the parametric resonance instability frequency by measuring actuation amplitude and/or velocity of the shuttle mass 402. The frequency value where the amplitude increases significantly at the instability frequency is known with precision. As the mass of the shuttle mass 402 increases, the transition frequency changes. Keeping track of the transition frequency allows for the measurement of the thickness of the material deposited on the growth monitor 310, as described further below.

Parametric resonance sensors measure shifts in frequency at a resonance stability boundary to monitor mass change on the shuttle mass 402. The amplitude and/or velocity transition at the resonance stability boundary is very sharp, thereby making small frequency changes easily detectable and the frequency shift resolution higher. The benefits of the parametric resonance sensor is that the sharpness of the boundary is not dependent on a Quality factor (Q). Therefore, very small mass changes can be detected in high-pressure environments as well as atmospheric pressure.

In contrast, simple harmonic resonance-based mass sensing devices, such as quartz crystal microbalances (QCMs), are limited by the ability to detect small frequency changes, described by the Quality factor (Q). The minimum detectable mass change using SHR is directly proportional to the minimum detectable frequency change, which is inversely proportional to the Q factor. So in applications in epitaxial mass deposition monitoring in which the typical pressures are in the 5 Torr to 760 Torr range, the minimum mass change detectable is significantly higher. This limits the range of processes that QCM based sensing can be used to monitor. However, the parametric resonance sensors of the present disclosure have a much wider process window than simple harmonic resonance-based sensing devices, enabling more accurate monitoring and detection, particularly in higher pressure and/or epitaxial deposition processes.

As the exhaust gas flows through the exhaust system 178, the unreacted precursor gases present in the reactant byproducts are deposited onto the growth monitor 310. The shuttle mass 402 is actuated using the voltage applied by the potential source 412. A periodic sweep over a small range of frequencies is performed near the parametric instability region. When an instability region is crossed, the vibration amplitude abruptly changes. In one embodiment, the capacitance sensor measures the vibration amplitude as the capacitance between the shuttle mass 402 and the capacitance sensor changes due to a shift in the position of the third finger set 424 in relation to the fourth finger set 426. The frequency at which this occurs is noted and compared with the value from the last frequency sweep. The change in frequency is related to the change in mass. Due to prior calibration, the change in mass due to condensation on the shuttle mass 402 relates to the thickness deposited on the substrate 102. This makes in situ and real time measurements of deposition on the substrate 102 possible.

In another embodiment, the amplitude and/or velocity sensor 406 is a laser doppler vibrometer. The laser doppler vibrometer is configured to measure the light reflected off the shuttle mass to characterize the actuation amplitude and/or velocity of the shuttle mass 402. The vibration amplitude is measured using laser doppler vibrometry. In one embodiment, the laser doppler vibrometry amplitude and/or velocity sensor has a 45-degree mirror built therein. The mirror may be cut by a focused ion beam after device fabrication. A laser light is aimed at the mirror and is reflected onto the shuttle mass 402. The reflected light from the shuttle mass 402 is measured to characterize the actuation amplitude and/or velocity of the shuttle mass 402. As the mass of the shuttle mass 402 increases due to the deposition of the exhaust gas, the measurements of the reflected light changes. The laser doppler vibrometer indirectly measures the change in the parametric resonance frequency by measuring the amplitude and/or velocity and noting the frequency at which a transition to a large amplitude oscillation begins. Tracking this change in the parametric resonance frequency over time, due to the increasing mass of the shuttle mass 402, allows for the determination of the thickness of material deposited on the growth monitor 310. Due to prior calibration, the change in mass due to condensation on the shuttle mass relates to the thickness deposited on the substrate 102.

The growth monitors 310 are configured to be positioned within the deposition chamber 100 and therefore account for the reactive process chemistries within the exhaust system 178. A protective coating, as well as the material of the anchors 408, the plurality of beams 410, and the shuttle mass 402, impact the reactivity of the growth monitors 310 with the process chemistries within the deposition chamber 100. Therefore, material compositions are chosen which reduce the reactivity of the growth monitor 310 with the process chemistries within the deposition chamber 100, while still enabling accurate film thickness measurements on the growth monitors 310.

The protective coating is formed from one of alumina ($Al_2O_3$) or a silicon oxide, such as silicon dioxide ($SiO_2$). The protective coating is formed from a material which does not degrade when exposed to epitaxial deposition process conditions or process gases. The protective coating may be a cover lens or may be a coating applied to the shuttle mass 402. The protective coating has a thickness of less than about 10 μm, such as about 1 nm to about 10 nm, such as about 1 nm to about 5 nm. The small thickness enables protection of the growth monitor 310 without significant damping of the actuation of the shuttle mass 402.

Figure 5:
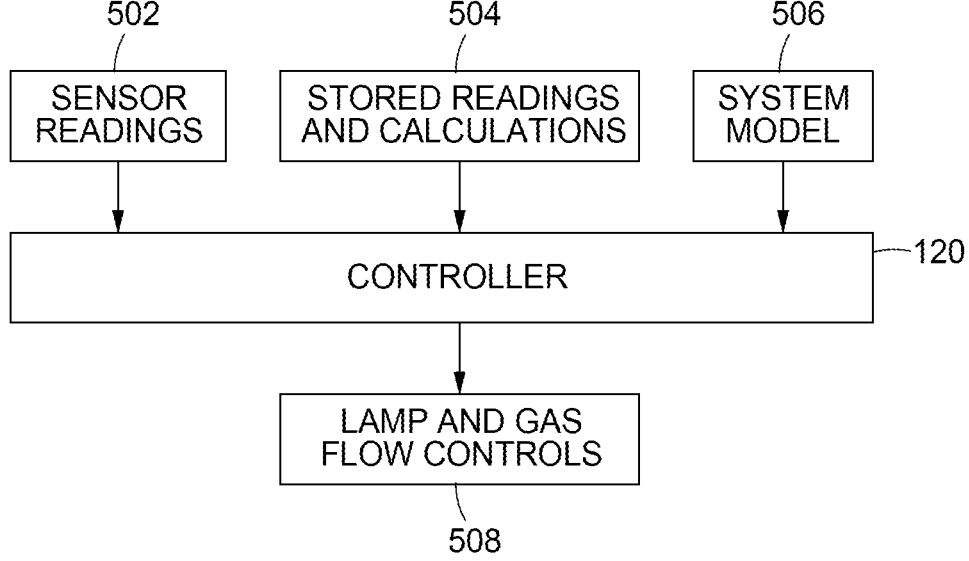
FIG. 5 illustrates a control schematic for use within the deposition chamber of FIG. 1, according to certain embodiments.

FIG. 5 illustrates a control schematic 500 for use within the deposition chamber 100 of FIG. 1, according to embodiments of the present disclosure. The controller 120 is configured to receive data or input as sensor readings 502 from each of the growth monitors 310. The controller 120 is equipped with or in communication with a system model 506 of the deposition chamber 100. The system model 506 includes a heating model and a gas flow module. The system model 506 is a program configured to estimate the gas flow and heating within the deposition chamber 100 throughout a deposition process. The controller 120 is further configured to store readings and calculations 504.

The readings and calculations 504 include previous sensor readings 502 as well as any other previous sensor readings within the deposition chamber 100. The readings and calculations 504 further include the stored calculated values from after the sensor readings 502 are measured by the controller 120 and run through the system model 506. Therefore, the controller 120 is configured to both retrieve stored readings and calculations 504 as well as save readings and calculations 504 for future use. Maintaining previous readings and calculations enables the controller 120 to adjust the system model 506 over time to reflect a more accurate version of the deposition chamber 100.

In embodiments described herein, the controller 120 includes a programmable central processing unit (CPU) that is operated with a memory and a mass storage device, an input control unit, and a display unit (not shown). The controller 120 monitors the precursor, process gas, and purge gas flow. Support circuits are coupled to the CPU for supporting the processor in a conventional manner. In some embodiments, the controller 120 includes multiple controllers 120, such that the stored readings and calculations 504 and the system model 506 are stored within a separate controller from the controller 120 which operations the deposition chamber 100. In other embodiments, all of the system model 506 and the stored readings and calculations 504 are saved within the controller 120.

The controller 120 is configured to control the heating and gas flow through the deposition chamber 100 by controlling aspects of the lamps and gas flow controls 508. The lamps and gas flow controls 508 include the upper lamps 141, the lower lamps 143, the process gas source 151, the purge gas source 162, and the exhaust pump 157. The controller 120 may also control the motion assembly 121 within the deposition chamber 100.

The controller 120 is configured to adjust the output to each of the lamps and gas flow controls 508 based off the sensor readings 502, the system model 506, and the stored readings and calculations 504. The controller 120 includes embedded software and a compensation algorithm to calibrate growth monitor 310 frequency shift to the film thickness on the substrate 102. The film thickness on the substrate 102 may be measured as the substrate 102 leaves the deposition chamber or between process operations to provide a reference for film thickness growth rates measured using the growth monitors 310. The controller 120 may include a machine-learning algorithm and may use a regression or clustering technique. The algorithm is an unsupervised or a supervised algorithm.

Figure 6:
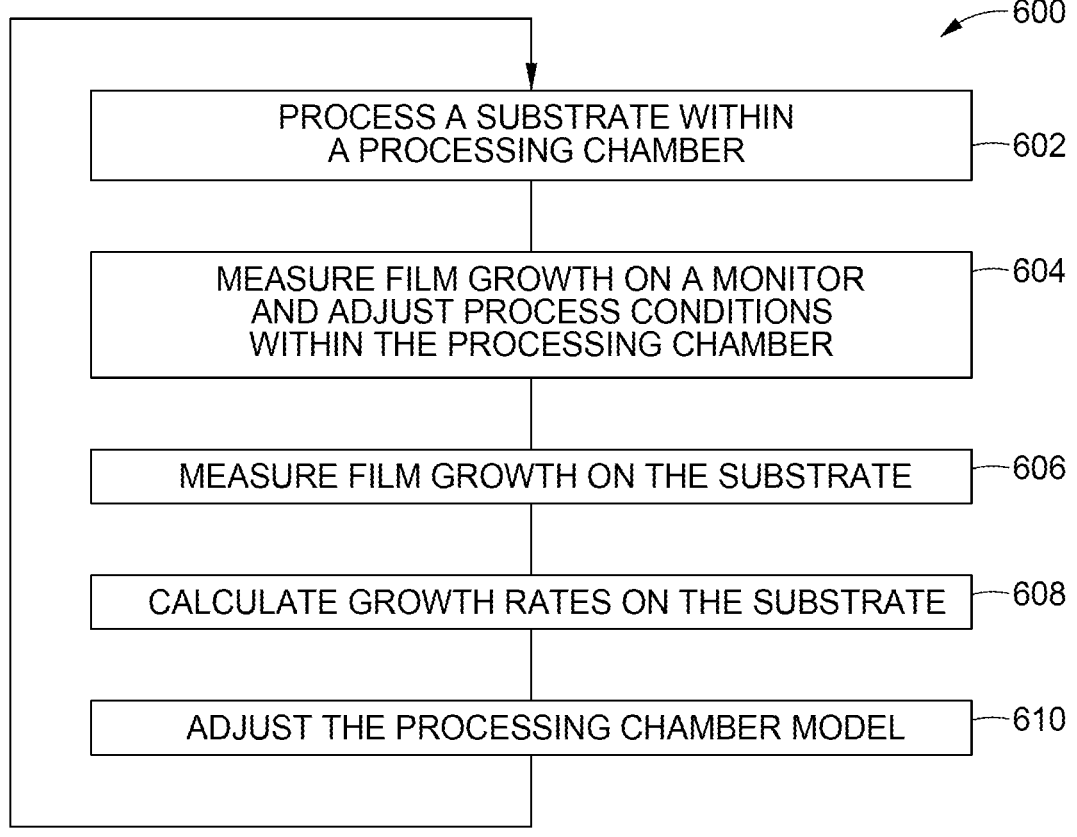
FIG. 6 illustrates a method of adjusting process conditions within the deposition chamber of FIG. 1, according to embodiments of the present disclosure.

FIG. 6 illustrates a method 600 of adjusting process conditions within the deposition chamber 100 of FIG. 1, according to embodiments of the present disclosure. The method 600 utilizes the growth monitors 310 within the deposition chamber 100 as well as the controller 120 described herein to improve film thickness uniformity and properties across the substrate 102.

During the method 600 a first substrate is processed within a processing chamber during an operation 602. The first substrate may be the substrate 102 and the processing chamber is the deposition chamber 100. Processing the first substrate during the operation 602 includes performing a deposition process on the first substrate, such as an epitaxial deposition process. The deposition process grows a film over the first substrate and includes heating the substrate using the upper lamps 141 and the lower lamps 143. Gas is flown through the process volume 136 from the process gas inlets 114 and the purge gas inlets 164 before being removed through the exhaust gas outlets 116.

As the first substrate is being processed within the processing chamber, the growth monitors 310 are used to measure the film thickness growth on the monitors during another operation 604. The measuring of the film thickness growth on the growth monitors 310 is performed as a rolling operation. A controller, such as the controller 120, is configured to receive input from a combination of the growth monitors 310 described with respect to FIGS. 3A-3B. The input is used to estimate film growth on the first substrate. Once the first substrate is done being processed within the processing chamber, the film thickness may be measured using one or more other non-contact sensors within the processing chamber or within an adjacent chamber during another operation 606. Measuring the film growth on the first substrate during the operation 606 is performed in a non-destructive manner, such as by using one or more non-contact sensors. The non-contact sensors may be a laser thickness gauge and may take multiple discreet measurements across the surface of the first substrate or may scan a length of the first substrate.

The non-contact sensors used during the operation 606 are not necessarily utilized for film thickness measurement during substrate processing as the process gases and radiation from the heating sources interfere with sensor readings to reduce reading sensitivity and precision. The growth monitors 310 therefore enable adjustment of the process conditions, such as heating and gas flow, while the first substrate is being processed. Measurement using the non-contact sensors can be used to update or confirm that the correlation between film formation on the growth monitor(s) 310 and film formation on the substrate. As such, measurement using non-contact sensors is optional and may be omitted.

The measurements of the film growth on the first substrate enables the growth rate on the first substrate to be calculated during another operation 608. Calculating the growth rate on the first substrate during the operation 608 verifies the accuracy of the models used within the controller and enables the processing chamber model to be adjusted during another operation 610 to achieve a predetermined film growth on the substrate during processing. Adjusting the processing chamber model during the operation 610 enables better use of the growth monitors 310 for a specific process. Once the model has been adjusted, processing of another substrate, such as a second substrate, is performed and the operations 602-610 are repeated. The operations 602 may be looped to continuously adjust the accuracy of the processing chamber model 610 and improve film thickness growth results. When preventative maintenance is performed on the processing chamber, the processing chamber model may be reset or adjusted and the method 600 begins again. Therefore, film thickness is results are improved continuously between each substrate. This further enables accurate film thickness and overcomes changes in processing chamber properties as films build up on surfaces within the process volume and as lamps age.

FIG. 7 illustrates a method 700 of utilizing a growth monitor 310, according to embodiments. At operation 702, a shuttle mass 402 is actuated with electrostatic forces from an electrostatic actuator. At operation 704, a range of frequencies are swept near the parametric resonance instability boundary of the shuttle mass 402. At operation 706, an exhaust gas is deposited on the shuttle mass 402, causing the amplitude of vibration of the shuttle mass 402 to abruptly change. The frequency value is noted by the controller 120. At operation 708, the current value of the instability frequency is compared to a previous value of the instability frequency. The difference in the values corresponds to a mass change of the shuttle mass 402 due to the deposition of the exhaust gas. The correspondence between instability frequency (and changes therebetween) related to mass may be empirically determined and stored in a data table, which is accessible by a controller. At operation 710, the controller 120 outputs a thickness value to the user. The thickness value is calculated using previous calibrations relating the mass change of the shuttle mass 402 to the thickness increase on the substrate 102. At operation 712, the range of frequencies near the parametric resonance boundary are periodically swept over to continuously monitor thickness change on the shuttle mass 402.

While the foregoing is directed to embodiments of the present disclosure, other and further embodiments of the disclosure may be devised without departing from the basic scope thereof, and the scope thereof is determined by the claims that follow.

What is claimed is:

1. An exhaust system for substrate processing, comprising:

a first exhaust plenum;

a first exhaust entry opening fluidly connected to the first exhaust plenum;

a first plurality of fins disposed adjacent to the first exhaust entry opening within the first exhaust plenum;

a first exhaust exit opening fluidly connected to the first exhaust plenum;

a first baffle plate disposed adjacent to the first exhaust exit opening and configured to narrow a width of the first exhaust plenum; and at least one growth monitor disposed downstream of the first baffle plate and configured to measure a thickness of a material deposited on the at least one growth monitor, wherein the at least one growth monitor is a parametric resonance sensor.

2. The exhaust system of claim 1, wherein the parametric resonance sensor comprises:

a shuttle mass;

an electrostatic actuator configured to actuate the shuttle mass at an actuation frequency;

an amplitude and/or velocity sensor configured to measure changes in an actuation amplitude and/or velocity of the shuttle mass;

a plurality of anchors; and a plurality of beams, wherein the plurality of beams are configured to couple the plurality of anchors to the shuttle mass and wherein the plurality of beams resist the actuation of the shuttle mass.

3. The exhaust system of claim 2, wherein the shuttle mass comprises one or more of a silicon containing material, bulk titanium, and electroplated nickel.

4. The exhaust system of claim 2, wherein the shuttle mass further comprises a first finger set and wherein the electrostatic actuator further comprises a second finger set, the first finger set being configured to actuate in parallel to the second finger set.

5. The exhaust system of claim 4, wherein the shuttle mass further comprises a third finger set, and wherein the amplitude and/or velocity sensor is a capacitance sensor, the capacitance sensor further comprising a fourth finger set, wherein the third finger set is configured to move in parallel to the fourth finger set as a result of the actuation of the shuttle mass.

6. The exhaust system of claim 5, wherein the capacitance sensor measures a change in a parametric resonance frequency as a mass of the shuttle mass increases to determine the thickness of the material deposited on the at least one growth monitor.

7. The exhaust system of claim 4, wherein the amplitude and/or velocity sensor is a laser doppler vibrometer configured to measure a light reflected off of the shuttle mass to track a change in a parametric resonance frequency of the shuttle mass.

8. The exhaust system of claim 7, wherein the laser doppler vibrometer measures a change in the actuation amplitude and/or velocity as a mass of the shuttle mass increases to determine the thickness of the material deposited on the at least one growth monitor.

9. A processing system suitable for semiconductor substrate processing, comprising:

a chamber body forming a process volume;

a substrate support disposed within the process volume of the chamber body;

an upper window disposed above the substrate support;

a lower window disposed below the substrate support, wherein the upper window and the lower window further define the process volume;

an injector disposed through one side of the chamber body and configured to introduce a process gas to the process volume; and an exhaust system disposed through a second side of the chamber body opposite the injector and comprising at least one growth monitor configured to measure a thickness of a material deposited on the at least one growth monitor, wherein the at least one growth monitor is a parametric resonance sensor.

10. The processing system of claim 9, wherein the parametric resonance sensor comprises:

a shuttle mass;

an electrostatic actuator configured to actuate the shuttle mass at an actuation frequency;

an amplitude and/or velocity sensor configured to measure changes in the actuation of the shuttle mass;

a plurality of anchors configured to couple to the exhaust system; and a plurality of beams, wherein the plurality of beams are configured to couple the plurality of anchors to the shuttle mass and wherein the plurality of beams resist the actuation of the shuttle mass.

11. The processing system of claim 10, wherein the shuttle mass comprises one or more of a silicon containing material, bulk titanium, and electroplated nickel.

12. The processing system of claim 10, wherein the shuttle mass further comprises a protective coating, wherein the protective coating is one of alumina or silicon dioxide.

13. The processing system of claim 9, wherein the at least one growth monitor is in communication with a controller configured to determine growth rates on the at least one growth monitor and adjust at least one of process gas flow rates, heating energy levels, or exhaust flow rates in response to the determined growth rates.

14. The processing system of claim 10, further comprising a controller, wherein the controller compares measured growth rates on the at least one growth monitor, a chamber thermal model, a chamber flow model, and previous monitor measurements to determine adjustments to at least one of a process gas flow rates, heating energy levels, or exhaust flow rates.

15. The exhaust system of claim 1, further comprising a controller storing instructions that, when executed by a processor, causes a process system to:

process the substrate within a processing chamber by flowing a process gas through a process volume from a process gas inlet, depositing the process gas on the substrate, and exhausting the process gas through the exhaust system;

deposit the process gas on the at least one growth monitor;

measure a film growth on the at least one growth monitor;

calculate a film growth rate on the substrate; and adjust a processing chamber parameter.

16. The exhaust system of claim 15, wherein the controller further causes actuation of a shuttle mass relative to a amplitude and/or velocity sensor.

17. The exhaust system of claim 16, the controller further causing the process system to sweep over a range of frequencies near a parametric resonance instability boundary of the shuttle mass at a first time interval and a second time interval to determine a parametric resonance instability frequency of the shuttle mass.

18. The exhaust system of claim 17, the controller further causing the process system to compare a value of the parametric resonance instability frequency of the shuttle mass at the first time interval to the value of the parametric resonance instability frequency of the shuttle mass at the second time interval to output the film growth on the substrate using the processing chamber parameter.

19. The exhaust system of claim 18, wherein the controller adjusts at least one of a process gas flow rate, a heating energy level, or an exhaust flow rate in response to the calculated film growth rate on the substrate.

20. The exhaust system of claim 19, wherein the controller compares measured growth rates on the at least one growth monitor, a chamber thermal model, a chamber flow model, and previous monitor measurements to determine adjustments to at least one of the process gas flow rate, the heating energy level, or the exhaust flow rate.

\* \* \* \* \*